(12) United States Patent
Choi

(10) Patent No.: US 6,943,538 B2
(45) Date of Patent: Sep. 13, 2005

(54) APPARATUS FOR AND METHOD OF MEASURING POWER CONSUMPTION

(75) Inventor: Young-hun Choi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 16 days.

(21) Appl. No.: 10/601,666

(22) Filed: Jun. 24, 2003

(65) Prior Publication Data

US 2004/0046543 A1 Mar. 11, 2004

(30) Foreign Application Priority Data

Sep. 6, 2002 (KR) .................................. 10-2002-0053825

(51) Int. Cl.[7] .............................................. G01R 11/32
(52) U.S. Cl. ..................................................... 324/142
(58) Field of Search ........................... 324/117 R, 765, 324/142, 760, 763, 158.1; 702/57, 60

(56) References Cited

U.S. PATENT DOCUMENTS 5,811,966 A * 9/1998 Lee ............................ 324/157
6,522,089 B1 * 2/2003 Duong et al. ............... 315/308
6,784,641 B2 * 8/2004 Sakai et al. ................. 320/132
2002/0049550 A1 4/2002 Jeong

* cited by examiner

*Primary Examiner*—Vinh Nguyen
*Assistant Examiner*—Tung X. Nguyen
(74) *Attorney, Agent, or Firm*—Staas & Halsey LLP

(57) ABSTRACT

An apparatus for and a method of measuring, in real-time, and indicating power consumption of a product powered by a switching mode power supply (SMPS). Power is supplied to the product through a transformer having a predetermined primary coil inductance, wherein a current of a primary coil of the transformer is turned ON and OFF by pulse-width modulation to supply the power to the electronic device. A drive voltage across the primary coil is monitored and a pulse waveform having a first level corresponding to an ON time of the current in the primary coil and a second level corresponding to an OFF time of the current in the primary coil is developed. Power consumption is calculated based on the drive voltage, the ON time of the current in the primary coil, the predetermined primary coil inductance, and a switching frequency of a pulse width modulator of the SMPS.

16 Claims, 4 Drawing Sheets

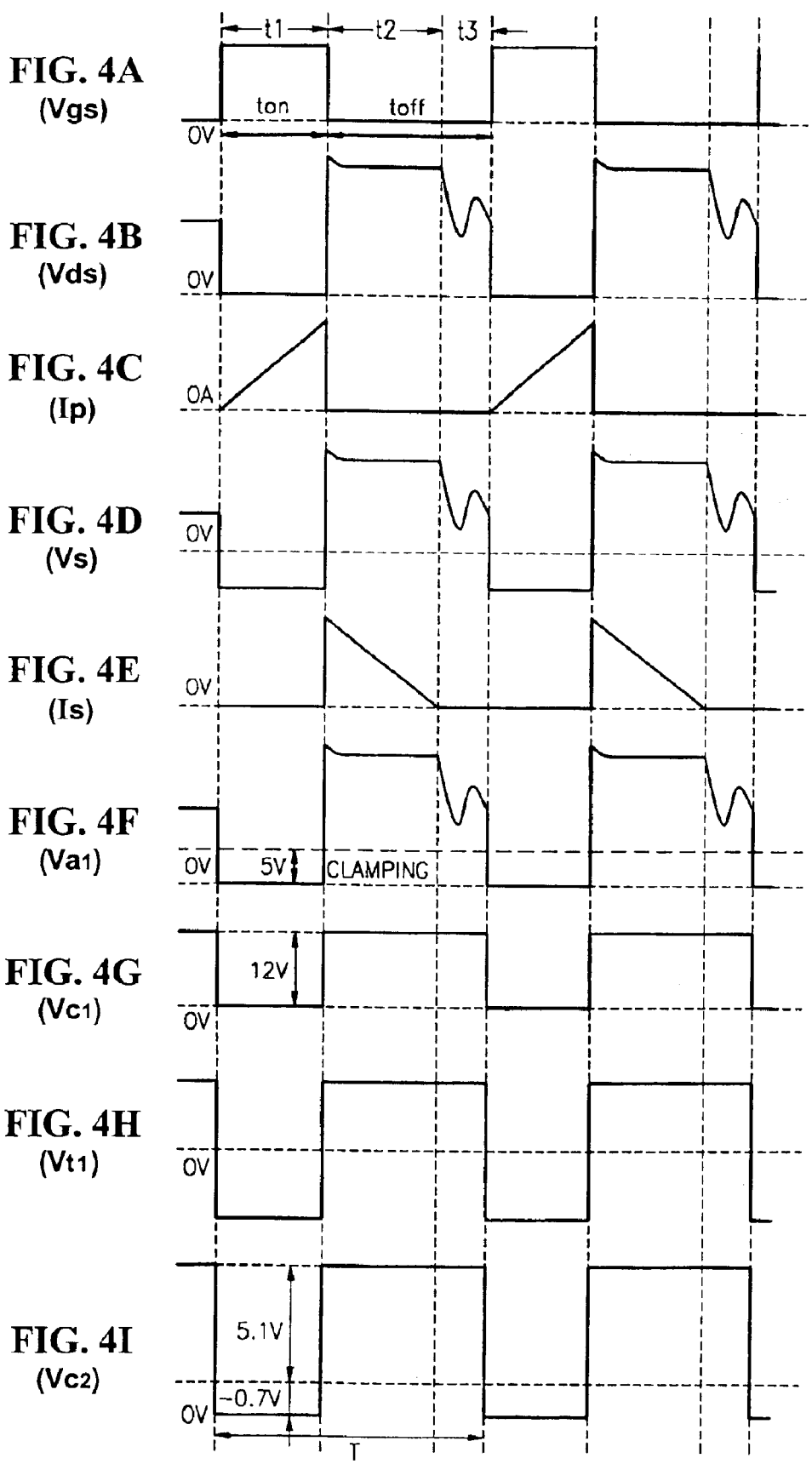

APPARATUS FOR AND METHOD OF MEASURING POWER CONSUMPTION

BACKGROUND OF THE INVENTION

This application claims the priority of Korean Patent Application No. 2002-52825, filed Sep. 6, 2002, in the Korean Intellectual Property Office, the disclosure of which is incorporated herein by reference.

1. Field of the Invention

The present invention relates to an apparatus for measuring power and, more particularly, to an apparatus for measuring, in real-time, and indicating power consumption of a product using a switching mode power supply (SMPS).

2. Description of the Related Art

Power consumption is a quantitative indication of the ratio of how much energy is consumed or how much work is done per unit of time, and indicates the amount of energy supplied or consumed in a unit second. An energy consumption efficiency grade of a product varies in accordance with the consumption power, and a low-grade product wastes energy during the entire life of the product. Therefore, it is desirable to confirm the energy consumption efficiency grade and purchase a higher-grade product if possible.

As an understanding of energy savings has recently become higher, various products now have a power saving function and keep the power consumption below a certain level even during normal operation. However, it would be highly desirable to indicate actual power consumption of a product while the product is in use. Displaying the actual power consumption has not been considered due to the complexity of a circuit needed to implement such a function and cost. Accordingly, the actual power consumption of a product has been measured in the product development stage using a separate measuring device. Further, consumers have not had a way to know the actual power consumption of a currently used product other than the maximum power consumption stated in the product manual or on a label attached to the product. However, as the consumers' understanding of energy saving functions and efficiencies have gradually changed, a need has arisen to provide a function for measuring, in real-time, and indicating the power consumption of a product while the product is in use.

SUMMARY OF THE INVENTION

To solve the above and/or other problems, it is an aspect of the present invention to provide an apparatus for measuring, in real-time, and indicating power consumption of a product.

Additional aspects and advantages of the invention will be set forth in part in the description which follows, and, in part, will be obvious from the description, or may be learned by practice of the invention.

According to an aspect of the present invention, an apparatus for measuring power consumption comprises a rectifying unit which rectifies and smoothes an AC voltage input to the rectifying unit, a transforming unit which receives the rectified voltage from the rectifying unit and produces a voltage at a secondary coil of the transforming unit in accordance with current fluctuations at a primary coil of the transforming unit, a switching unit which switches on or off the output voltage at the primary coil of the transforming unit with pulse-width modulation (PWM) control signals generated from a feedback voltage and a synchronous signal, a voltage regulating unit which regulates the output voltage at the primary coil of the transforming unit to calculate a turn-on time of the switching unit, and a control unit which calculates the turn-on time from the output of the voltage regulating unit and calculates power consumption from the calculated turn-on time, the switching frequency of the switching unit and the inductances of the transforming unit.

According to an aspect of the present invention, the apparatus for measuring power consumption may further comprise a display unit which indicates the power consumption calculated by the control unit.

According to an aspect of the present invention, the voltage regulating may comprise a voltage decreasing section which decreases the voltage at the primary coil of the transforming unit below a certain level, a first clamp which clamps the decreased voltage at a first constant voltage level, a transformer which transforms the first clamped voltage, and a second clamp which clamps the transformed voltage at a second constant voltage level.

According to an aspect of the present invention, an apparatus for measuring power consumption comprises a rectifying unit which rectifies and smoothes an AC voltage input to the rectifying unit, a transforming unit which receives the rectified voltage from the rectifying unit and produces a voltage at a secondary coil of the transformer in accordance with current fluctuations at a primary coil of the transformer, a switching unit which switches on or off the output voltage at the primary coil of the transforming unit with pulse-width modulation (PWM) control signals generated from a feedback voltage and a synchronous signal, a voltage regulating unit which regulate the voltage at the secondary coil of the transforming unit to calculate a turn-on time of the switching unit, and a control unit which calculates the turn-on time from the output of the voltage regulating unit and calculates power consumption from the calculated turn-on time, the switching frequency of the switching unit and the inductances of the transforming unit.

According to an aspect of the present invention, an the apparatus for measuring power consumption may further comprise a display unit which indicates the power consumption calculated by the control unit.

According to an aspect of the present invention, the voltage regulating unit may comprise a voltage decreasing section which decreases the voltage at the secondary coil of the transforming unit below a certain level, and a clamp which clamps the output of the voltage decreasing section at a constant voltage level.

According to an aspect of the present invention, an apparatus for measuring power consumption comprises a rectifying unit which rectifies and smoothes an AC voltage input to the rectifying unit, a transforming unit which receives the rectified voltage from the rectifying unit and produces a voltage at a secondary coil of the transforming unit in accordance with current fluctuations at a primary coil of the transforming unit, a switching unit which switches on or off the output voltage at the primary coil of the transforming unit with pulse-width modulation (PWM) control signals generated from a feedback voltage and a synchronous signal, a voltage regulating unit which regulates the voltage at one of the primary coil and the secondary coil of the transforming unit to calculate a turn-on time of the switching unit, and a control unit which calculates the turn-on time from an output of the voltage regulating unit and calculates power consumption from the calculated turn-on time, the AC input voltage at the primary coil, the switching frequency of the switching unit and the inductances of the transforming unit.

According to an aspect of the present invention, the apparatus for measuring power consumption may further comprise a display unit which indicates the power consumption calculated by the control unit.

According to an aspect of the present invention, where the voltage regulating unit regulates the voltage at the primary coil of the transforming unit to calculate the turn-on time of the switching unit, the voltage regulating unit may comprise a voltage decreasing section which decreases the voltage at the primary coil of the transforming unit below a certain level, a first clamp which clamps the decreased voltage at a first constant voltage level, a transformer which transforms the first clamped voltage, and a second clamp which clamps the transformed voltage at a second constant voltage level.

According to an aspect of the present invention where the voltage regulating unit regulates the voltage at the secondary coil of the transforming unit to calculate the turn-on time of the switching unit, the voltage regulating unit may comprise a voltage decreasing section which decreases the voltage at the secondary coil of the transforming unit below a certain level, and a clamp which clamps the output of the voltage decreasing section at a constant voltage level.

BRIEF DESCRIPTION OF THE DRAWINGS

The above and/or other aspects and advantages of the present invention will become more apparent by describing in detail embodiments thereof with reference to the attached drawings in which:

FIGS. 4A–4I show waveforms for explaining an operation of the apparatus shown in FIG. 3.

DESCRIPTION OF THE PREFERRED EMBODIMENTS

Figure 3:
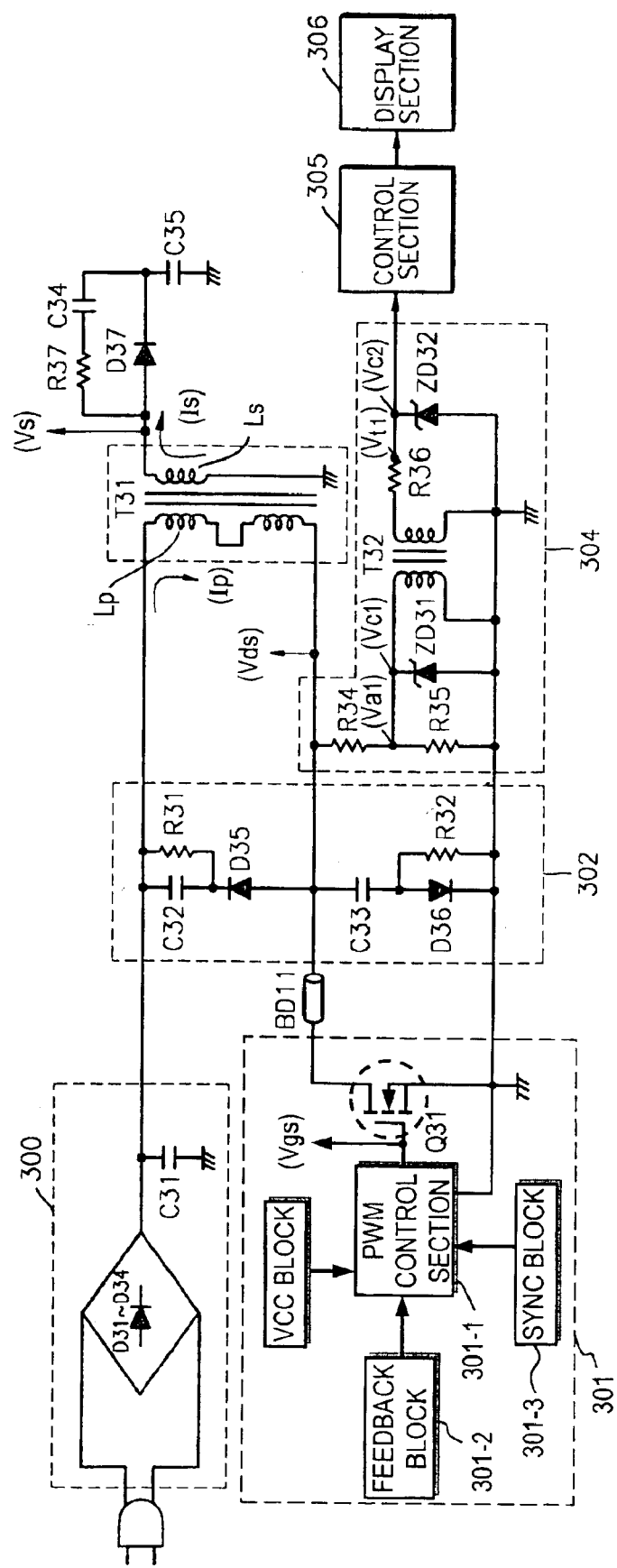
FIG. 3 is a circuit diagram of an apparatus for measuring power consumption according to another embodiment of the present invention.

Typically, power consumption of a product is measured with an exclusive measuring device at AC input lines to which power is supplied. Such a measuring device requires a complex circuit, and is inapplicable to a product. The present invention provides a method of measuring power consumption using a voltage $V_s$ at a secondary coil of a transformer T11 as shown in FIG. 1 and a method of measuring power consumption using a voltage $V_{ds}$ at a primary coil of a transformer T31 as shown in FIG. 3.

Figure 1:
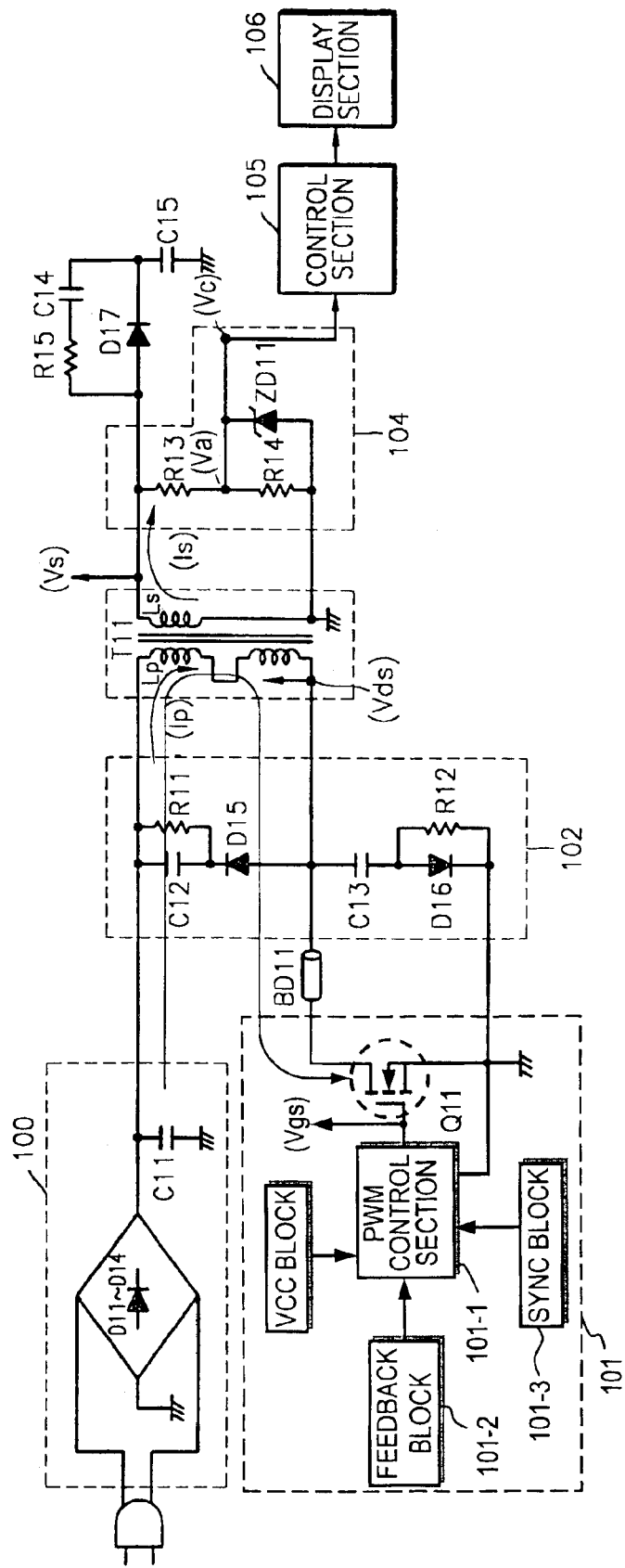
FIG. 1 is a circuit diagram of an apparatus for measuring power consumption according to an embodiment of the present invention.

With reference to FIGS. 1 and 2A–2G, a method of measuring power consumption using the voltage $V_s$ at the secondary coil of the transformer T11 will be described below. FIG. 1 is a circuit diagram of an apparatus for measuring power consumption according to a first embodiment of the present invention. The apparatus shown in FIG. 1 comprises a rectifying section 100, a switching section 101, a snubber circuit 102, a transformer T11, a voltage regulating section 104, a control section 105, and a display section 106.

The rectifying section 100 rectifies and smoothes input AC current power to produce a DC voltage. The smoothed DC voltage is applied to a first end of a primary coil of the transformer T11. The switching section 101 switches on or off the voltage output at a second end of the primary coil of the transformer T11 with pulse-width modulation (PWM) control signals. The switching section 101 comprises a PWM control section 101-1 which generates PWM signals based on feedback voltages from a feedback block 101-2 and synchronous signals from a synchronous (SYNC) block 101-3, and a field effect transistor (FET) Q11 which switches the second end of the primary coil in response to the PWM signals.

The snubber circuit 102 prevents the destruction of the FET Q11 by suppressing surge voltages generated when the FET Q11 turns off. The snubber circuit 102 comprises an upper snubber circuit comprising a resistor R11, a capacitor C12 and a diode D15, and a lower snubber circuit comprising a resistor R12, a capacitor C13 and a diode D16. With regard to the upper snubber circuit, when the FET Q11 turns-off, a surge voltage generated at the primary coil of the transformer T11 rapidly increases, and if the surge voltage exceeds a predetermined voltage, then the switching section 101 is destroyed. Therefore, the upper snubber circuit prevents the destruction of the FET Q11 by suppressing voltage surges in such a way that the voltage surge generated when the FET Q11 turns off charges the capacitor C12 through the diode D15 and, then, gradually discharges through the resistor R11. The lower snubber circuit prevents the destruction of the FET Q11 by suppressing a surge voltage when the FET Q11 turns off so that the surge voltage generated at the primary coil of the transformer T11 charges capacitor C13 through the diode D16 and, then, gradually discharges through the resistor R12.

Figure 2:
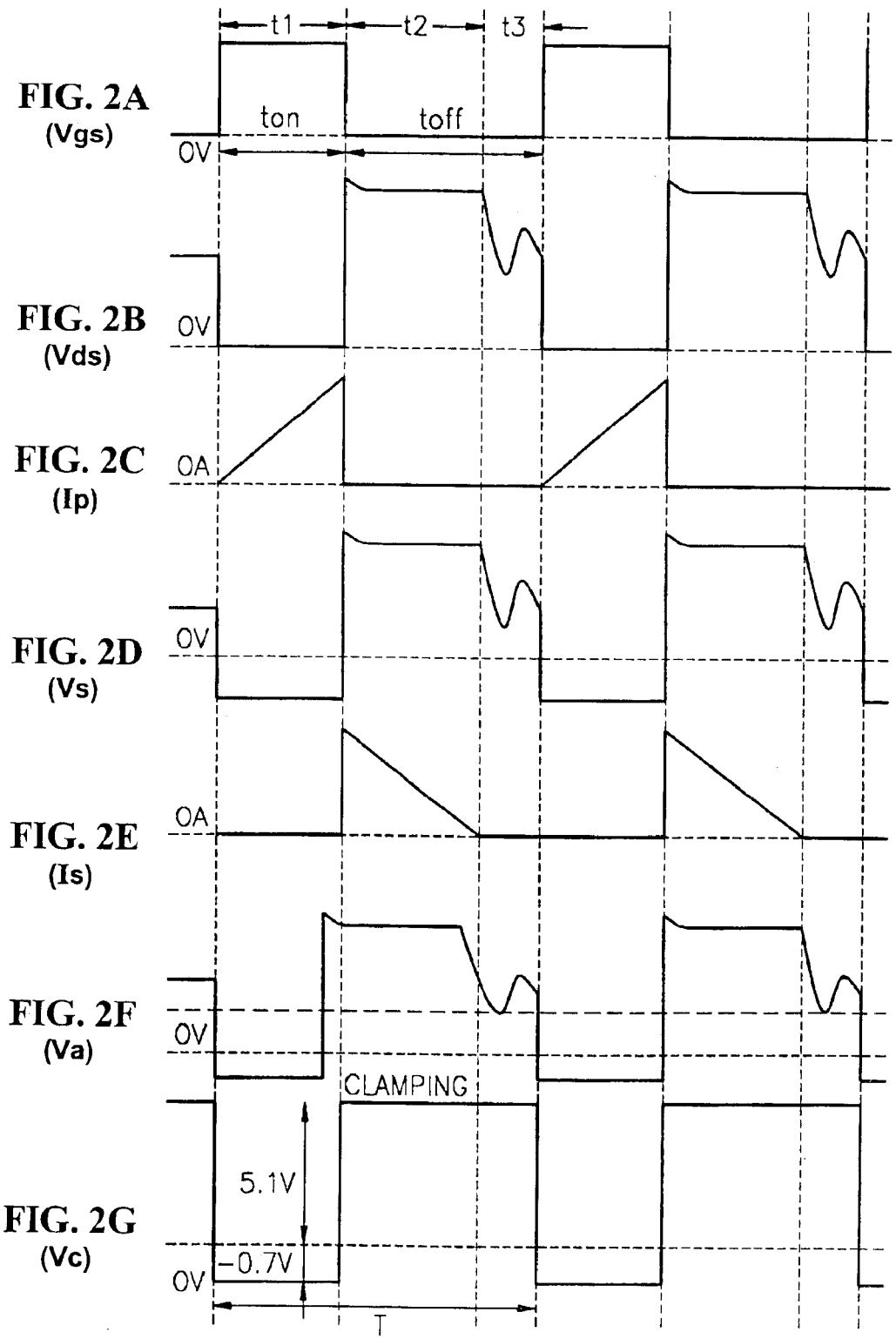
FIGS. 2A–2G show waveforms for explaining an operation of the apparatus shown in FIG. 1.

The transformer 103 stores energy at its primary coil $L_p$ when the FET Q11 turns on and provides energy to its output when the FET Q11 turns off. Operation of the transformer 103 in time intervals t1, t2 and t3 will be described with reference to FIGS. 2A through 2G. Referring now to FIG. 2A, during the time interval t1, when a gate voltage of about 10V is applied to the FET Q11, the FET Q11 turns on and, accordingly, the voltage $V_{ds}$ becomes 0V (FIG. 2B). The smoothed DC voltage from the rectifying section is applied across the primary coil $L_p$ of the transformer 103 and a current $I_p$ starts to flow (FIG. 2C). When the current $I_p$ flows, the primary coil $L_p$ is charged with an energy of $\frac{1}{2}L_p*I_p^2$ joules. At this moment, since a voltage having a reverse polarity is applied across the secondary coil $L_s$ (FIG. 2D), a current $I_s$ does not flow (FIG. 2E).

During the time interval t2, the FET Q11 turns off at the instant the gate voltage $V_{gs}$ of the FET Q11 becomes 0V (FIGS. 2A and 2B) and, accordingly, the current $I_p$ does not flow (FIG. 2C) so that the polarity across the primary coil $L_p$ is changed by a counter electromotive force caused by the inductor characteristic for keeping the previous magnetic flux. Therefore, the inductor energy, $\frac{1}{2}L_p * I_p^2$ joules, stored at the primary coil $L_p$, moves to the secondary coil (FIG. 2D). During the time interval t3, after all of the energy stored at the primary coil has been transferred to the secondary coil, the current $I_s$ becomes 0A (FIG. 2E) so that no more current flows through the secondary coil.

The diodes D11 through D14 of the rectifying section 100 rectify and smooth the AC voltages at the capacitor C11 corresponding to the following equation (1):

$$V_i(dc)=V_{in}(ac) \times \sqrt{2} \times 0.9[V_{dc}] \qquad (1)$$

At the instant the FET Q11 switches, the current $I_p$ flows from the capacitor C11 to the FET Q11, and the power consumption at this instant corresponds to the following equation (2):

$$P = \frac{1}{2} L_p \times I_p^2 \times f [W] \quad (2)$$

In equation (2), f is the switching frequency of the switching section 101, and $L_p$ is the inductance of the primary coil of the transformer 103, which is known to the manufacturer. Therefore, if the current $I_p$ is known at the instant the FET Q11 turns on, the resultant power consumption may be calculated by equation (2). However, there is a difficulty in measuring the value of the current $I_p$, because an exclusive measuring device is normally required for that purpose. Nevertheless, the value of the current $I_p$ may be obtained from the following equation (3):

$$I_p = \frac{1}{L_p}(V_i \times t_{on})[A] \quad (3)$$

That is, the value of the current $I_p$ may be obtained by the turn-on time of the FET Q11, and the resultant power consumption may be calculated by the following equation (4):

$$P = \frac{1}{2} \frac{V_i^2 \times t_{on}^2}{L_p} \times f [W] \quad (4)$$

Therefore, if the turn-on time of the FET Q11 is known, the resultant power consumption may be calculated by the equation (4). Now, the voltage regulating section 104 that provides the signals for calculating the turn-on time of the FET Q11 with the voltage $V_s$ at the secondary coil of the transformer 103 will be described.

At the instant the FET Q11 turns off, the waveform of the voltage $V_s$, which is generated at the secondary coil of the transformer 103 due to the counter electromotive force, rises as shown in FIG. 2D. As shown in FIG. 2D, a time interval when the secondary voltage $V_s$ decreases below the ground level corresponds to the turn-on time of the FET Q11. In the voltage regulating section 104 shown in FIG. 1, the resistors R13 and R14 form an attenuator which decreases the secondary voltage $V_s$ to provide an attenuated waveform $V_a$ shown in FIG. 2F. A clamp device such as a Zener diode ZD11 clamps voltages above 5.1V to 5.1V and voltages below −0.7V to −0.7V to provide a clamped waveform $V_c$ shown in FIG. 2G and outputs the clamped signal to the control section 105.

The control section 105 calculates the switching frequency (1/T) of the switching section 101, which is provided from the voltage regulating section 104, and the turn-on time of the FET Q11, which corresponds to the time interval shown as the low level area in FIG. 2G. Therefore, the resultant power consumption may be obtained by substituting the calculated turn-on time of the FET Q11 in the equation (4). Such calculated power consumption may be indicated by a display section 106, if consumers wish to have such a display.

With reference to FIGS. 3 and 4A through 4I, a method of measuring power consumption using a voltage $V_{ds}$ at a primary coil of a transformer 303 will be described below. FIG. 3 is a circuit diagram of an apparatus for measuring power consumption according to a second embodiment of the present invention. The apparatus shown in FIG. 3 comprises, a rectifying section 300, a switching section 301, a snubber circuit 302, the transformer T31, a voltage regulating section 304, a control section 305, and a display section 306.

The rectifying section 300 rectifies and smoothes input AC current power to produce a DC voltage. The smoothed DC voltage is applied to a first end of a primary coil $L_p$ of the transformer T31. The switching section 301 switches on or off the voltage output at a second end of the primary coil of the transformer T31 with PWM control signals. The switching section 301 comprises a PWM control section 301-1 which generates PWM signals based on feedback voltages from a feedback block 301-2 and synchronous signals from a synchronous (SYNC) block 301-3, and a field effect transistor (FET) Q31 switches the second end of the primary coil $L_p$ in response to the PWM signals.

The snubber circuit 302 prevents the destruction of the FET Q31 by suppressing surge voltages generated when the FET Q31 turns off. The snubber circuit 302 comprises an upper snubber circuit comprising a resistor R31, a capacitor C32 and a diode D35, and a lower snubber circuit comprising a resistor R32, a capacitor C33 and a diode D36. With regard to the upper snubber circuit, when the FET Q31 turns-off, a surge voltage generated at the primary coil $L_p$ of the transformer T31 rapidly increases, and if the surge voltage exceeds a predetermined voltage, then the switching section 301 is destroyed. Therefore, the upper snubber circuit prevents destruction of the FET Q31 by suppressing voltage surges in such a way that the voltage surge generated when the FET Q31 turns off charges the capacitor C32 through the diode D35 and, then, gradually discharges through the resistor R31. The lower snubber circuit prevents destruction of the FET Q31 by suppressing surge voltages when the FET Q31 turns off so that the surge voltage generated at the primary coil of the transformer T31 charges the capacitor C33 through the diode D36 and, then, gradually discharges through the resistor R32.

The transformer T31 stores energy in the primary coil $L_p$ when the FET Q31 turns on and provides energy to a secondary coil $L_s$ when the FET Q31 turns off. The operation of the transformer T31 in the time intervals, t2 and t3 will be described with reference to FIGS. 4A through 4I. During the time interval t1, when a voltage of about 10V is applied to the gate of the FET Q31 (FIG. 4A), the FET Q31 turns on and, accordingly, the voltage $V_{ds}$ becomes 0V (FIG. 4B). With the DC input voltage applied across the primary coil $L_p$ of the transformer T31, a current $I_p$ starts to flow (FIG. 4C). When the current $I_p$ flows, the primary coil $L_p$ is charged with energy of $\frac{1}{2} L_p * I_p^2$ joules. At this moment, since a voltage having a reverse polarity is applied across the secondary coil $L_s$ (FIG. 4D), the current $I_s$ does not flow (FIG. 4E). During the time interval t2, the FET Q31 turns off when the gate voltage $V_{gs}$ of the FET Q31 becomes 0V (FIGS. 4A and 4B) and, accordingly, the current $I_p$ does not flow (FIG. 4C) so that the polarity across the primary coil $L_p$ is changed by a counter electromotive force caused by the inductor characteristic for keeping the previous magnetic flux. Therefore, the inductor energy, $\frac{1}{2} L_p * I_p^2$ joules, stored at the primary coil $L_p$ moves to the secondary coil $L_s$ (FIG. 4D). During the time interval t3, after all of the energy stored at the primary coil has been transferred to the secondary coil, the current $I_s$ becomes 0A (FIG. 4E) so that no more current flows through the secondary coil.

The diodes D31 through D34 of the rectifying section 300 rectify and smooth the AC voltages at the capacitor C31 corresponding to the following equation (5):

$$V_i(dc) = V_{in}(ac) \times \sqrt{2} \times 0.9 [V_{dc}] \quad (5)$$

At the instant when the FET Q31 switches on, the current $I_p$ flows from the capacitor C31 through the FET Q31, and the power consumption at the instant of switching corresponds to the following equation (6):

$$P = \frac{1}{2} L_p \times I_p^2 \times f \, [W] \qquad (6)$$

In the above equation (6), f is the switching frequency of the switching section 101, and $L_p$ is the inductance of the primary coil of the transformer, which is known to the manufacturer. Therefore, if the current $I_p$ is known at the instant when the FET Q31 turns on, the resultant power consumption may be calculated by the equation (6). However, there is a difficulty in measuring the value of the current $I_p$, because an exclusive measuring device is normally required for that purpose. Nevertheless, the value of the current $I_p$ can be obtained from the following equation (7):

$$I_p = \frac{1}{L_p}(V_i \times t_{on}) \, [A] \qquad (7)$$

That is, the value of the current $I_p$ may be obtained by the turn-on time of the FET Q31, and the resultant power consumption may be calculated by the following equation (8):

$$P = \frac{1}{2} \frac{V_i^2 \times t_{on}^2}{L_p} \times f \, [W] \qquad (8)$$

Therefore, if the turn-on time of the FET Q31 is known, the resultant power consumption can be calculated by the above equation (8).

The voltage regulating section 304 provides signals for calculating the turn-on time of the FET Q31 with the voltage $V_{ds}$ at the primary coil of the transformer T31 and will be described below.

Resistors R34 and R35 form an attenuator which attenuates the level of the primary voltage $V_{ds}$ shown in FIG. 4D to a convenient level, such as for example, a level of ⅟₂₀ $V_{ds}$. A waveform of the attenuated primary voltage $V_{ds}$ is illustrated in FIG. 4F. A first clamp device such as a Zener diode ZD31 clamps the voltage of the attenuated primary voltage $V_{a1}$ above 12V to 12V ($V_{c1}$) as shown in FIG. 4G. A transformer T32 transfers the clamped primary voltage $V_{c1}$ to a secondary coil of the transformer T32 as a voltage $V_{t1}$. The mutual inductances of the transformer T32 transfer the signals as an AC signal to obtain the waveform as shown in FIG. 4H. It is noted that, in the waveform of FIG. 4H, the upper and lower portions with reference to 0V have a same amplitude. A second clamp device such as a Zener diode ZD32 clamps a voltage above 5.1V to 5.1V and a voltage below −0.7V to −0.7V to provide waveform $V_{c2}$ shown in FIG. 4I and outputs the clamped signal to the control section 305.

The control section 305 calculates the switching frequency (1/T) of the switching section 301, which is provided from the voltage regulating section 304, and the turn-on time of the FET Q31, which corresponds to the time interval shown as the low level area (−0.7V) in FIG. 4I. Therefore, the resultant power consumption may be obtained by substituting the calculated turn-on time of the FET Q31 in the above equation (8). Such calculated power consumption may be indicated by a display section 306, if consumers wish to have such a display.

According to the above description of the present invention, a method of measuring power consumption by using the voltage $V_s$ at the secondary coil of a transformer T11 or a method for measuring power consumption by using the voltage $V_{ds}$ at the primary coil of a transformer T31 may be implemented. However, a circuit may be constructed in view of the above disclosure which implements both methods in the same circuit.

According to the present invention, by measuring, in real-time, and indicating the power consumption of a product using a SMPS as described above, normal operation of the product may be confirmed by consumers and reliability of the product is improved.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. An apparatus for measuring power consumption comprising:
    a rectifying unit which rectifies and smoothes an AC voltage input to output a DC voltage;
    a transforming unit having a primary coil and a secondary coil, the first coil receiving the DC voltage from the rectifying unit and the secondary coil producing a voltage in accordance with current fluctuations in the primary coil;
    a switching unit which switches on or off the DC voltage at the primary coil with pulse-width modulation (PWM);
    a voltage regulating unit which regulates a voltage derived from the voltage at the primary coil of the transforming unit; and
    a control unit which:
        calculates a turn-on time of the switching unit based on the regulated voltage, and
        calculates power consumption based on the calculated turn-on time, a switching frequency of the switching unit and an inductance of the transforming unit.

2. The apparatus for measuring power consumption according to claim 1, further comprising:
    a display unit which indicates the power consumption calculated by the control unit.

3. The apparatus for measuring power consumption according to claim 1, wherein the voltage regulating unit comprises:
    a voltage decreasing section which decreases the voltage derived from the primary coil of the transforming unit below a certain level,
    a first clamp which clamps the decreased voltage at a first constant voltage level,
    a transformer which transforms the first clamped voltage, and
    a second clamp which clamps the transformed voltages at a second constant voltage level to output the regulated voltage.

4. An apparatus for measuring power consumption comprising:
    a rectifying unit which rectifies and smoothes AC voltages input to output a DC voltage;
    a transforming unit having a primary coil and a secondary coil, the primary coil receiving the DC voltage and the secondary coil producing a voltage in accordance with current fluctuations in the primary coil;
    a switching unit which switches on or off the output voltages at the primary coil with pulse-width modulation (PWM);

a voltage regulating unit which regulates a voltage derived from the voltage at the secondary coil of the transforming unit; and a control unit which:
calculates a turn-on time of the switching unit based on the regulated voltage, and
calculates power consumption based on the calculated turn-on time, a switching frequency of the switching unit and an inductance of the transforming unit.

5. The apparatus for measuring power consumption according to claim 4, further comprising:
a display unit which indicates the power consumption calculated by the control unit.

6. The apparatus for measuring power consumption according to claim 4, wherein the voltage regulating unit comprises:
a voltage decreasing section which decreases the voltage derived from the voltage of the secondary coil of the transforming unit below a certain level, and
a clamp which clamps the decreased voltage at a constant voltage level.

7. An apparatus for measuring power consumption comprising:
a rectifying unit which rectifies and smoothes AC voltages input to the rectifying unit to output a DC voltage;
a transforming unit having a primary coil and a secondary coil, to produce a voltage at the secondary coil in accordance with current fluctuations in the primary coil;
a switching unit which switches on or off the DC voltage at the primary coil with pulse-width modulation (PWM);
a voltage regulating unit which regulates at least one of a first voltage derived from the voltage at the primary coil and a voltage derived from the secondary coil; and
a control unit which:
calculates a turn-on time of the switching unit based on the at least one derived voltage, and
calculates power consumption based on the calculated turn-on time, a switching frequency of the switching unit and an inductance of the transforming unit.

8. The apparatus for measuring power consumption according to claim 7, further comprising a display unit which indicates the power consumption calculated by the control unit.

9. The apparatus for measuring power consumption according to claim 7, wherein:
where the voltage regulating unit regulates the first voltage derived from the voltage at the primary coil, the voltage regulating unit comprises:
a voltage decreasing section which decreases the voltage derived from the primary coil of the transforming unit below a certain level,
a first clamp which clamps the decreased voltage at a first constant voltage level,
a transformer which transforms the first clamped voltage, and
a second clamp which clamps the transformed voltage at a second constant voltage level.

10. The apparatus for measuring power consumption according to claim 7, wherein:
where the voltage regulating unit regulates the second voltage at the secondary coil of the transforming unit, the voltage regulating unit comprises:
a voltage decreasing section which decreases the voltage derived from the secondary coil of the transforming unit below a certain level, and
a clamp which clamps the decreased voltage at a constant voltage level.

11. An apparatus for calculating power consumption of an electronic device which is powered through a transformer having a predetermined primary coil inductance, wherein a current of a primary coil of the transformer is turned ON and OFF by pulse-width modulation to supply power from an input voltage to the electronic device through a secondary coil of the transformer, the apparatus comprising:
a sampling circuit which outputs a sampled pulse waveform having a first level corresponding to an ON time of the current in the primary coil and a second level;
a controller which:
determines the ON time of the current and a switching frequency of the pulse width modulation based on the sampled pulse waveform, and
calculates the power consumption based on the ON time of the current, the switching frequency of the pulse width modulation, a value of the input voltage and the predetermined primary coil inductance.

12. The apparatus of claim 11, wherein the controller calculates the power consumption according to an equation:

$$P = \frac{1}{2} \frac{V_i^2 \times t_{on}^2}{L_p} \times f(W),$$

where: P is the calculated power consumption,
$V_i$ is the value of the input voltage,
$L_p$ is the predetermined primary coil inductance,
$t_{on}$ is the ON time of the current in the primary coil, and
f(W) is a switching frequency of the pulse width modulation.

13. The apparatus of claim 12, wherein:
a first end of the primary coil is connected to the input voltage;
another voltage is generated at a second end of the primary coil due to the switching of the current; and
the sampling circuit comprises:
an attenuator which attenuates the generated voltage at the second end of the primary coil,
a voltage clamp which limits the attenuated voltage to a first peak to peak value,
a second transformer which transforms the limited peak to peak voltage to a voltage having a second peak to peak value, and
a second voltage clamp which limits the transformed voltage to a third peak to peak value, to output the sampled pulse waveform.

14. The apparatus of claim 12, wherein the sampling circuit comprises:
an attenuator which attenuates a voltage generated at the secondary coil by the switching of the current; and
a clamp circuit which limits the attenuated voltage to a predetermined peak to peak value, to output the sampled pulse waveform.

15. The apparatus of claim 11, wherein:
a first end of the primary coil is connected to the input voltage;
another voltage is generated at a second end of the primary coil due to the switching of the current; and
the sampling circuit comprises:
an attenuator which attenuates the generated voltage at the second end of the primary coil,
a voltage clamp which limits the attenuated voltage to a first peak to peak value, a second transformer which transforms the limited peak to peak voltage to a voltage having a second peak to peak value, and a second voltage clamp which limits the transformed voltage to a third peak to peak value, to output the sampled pulse waveform.

16. The apparatus of claim 11, wherein the sampling circuit comprises:

an attenuator which attenuates a voltage generated at the secondary coil by the switching of the current; and a clamp circuit which clamps the attenuated voltage at a predetermined peak to peak value, to output the sampled pulse waveform.

* * * * *